US012652958B2

(12) United States Patent
Namba

(10) Patent No.: US 12,652,958 B2
(45) Date of Patent: Jun. 9, 2026

(54) PIEZOELECTRIC ELEMENT

(71) Applicant: KYOCERA Corporation, Kyoto (JP)

(72) Inventor: Keisuke Namba, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 807 days.

(21) Appl. No.: 18/012,422

(22) PCT Filed: Jul. 1, 2021

(86) PCT No.: PCT/JP2021/024969
§ 371 (c)(1),
(2) Date: Dec. 22, 2022

(87) PCT Pub. No.: WO2022/004848
PCT Pub. Date: Jan. 6, 2022

(65) Prior Publication Data
US 2023/0320220 A1      Oct. 5, 2023

(30) Foreign Application Priority Data
Jul. 3, 2020     (JP) ................................. 2020-115960

(51) Int. Cl.
*H01L 41/047*          (2006.01)
*H10N 30/20*          (2023.01)
(Continued)

(52) U.S. Cl.
CPC ....... *H10N 30/2041* (2023.02); *H10N 30/503* (2023.02); *H10N 30/871* (2023.02); *H10N 30/872* (2023.02)

(58) Field of Classification Search
CPC ............. H10N 30/2041; H10N 30/871; H10N 30/872; H10N 30/50
(Continued)

(56) References Cited

U.S. PATENT DOCUMENTS

2004/0251771 A1    12/2004  Dames
2005/0023936 A1     2/2005  Futamata et al.
(Continued)

FOREIGN PATENT DOCUMENTS

CN          1547779  A    11/2004
CN       109119529  A     1/2019
(Continued)

*Primary Examiner* — Derek J Rosenau
(74) *Attorney, Agent, or Firm* — Volpe Koenig

(57)          ABSTRACT

A piezoelectric element includes a stack including a plurality of internal electrodes and a plurality of piezoelectric layers stacked on one another, and a surface electrode located on a side surface of the stack and electrically connected to the plurality of internal electrodes. The stack includes the piezoelectric layers being stacked and the internal electrodes each between adjacent piezoelectric layers. The internal electrodes include a first electrode that applies a voltage to the piezoelectric layers to cause the stack to bend in a first direction (X-direction) orthogonal to a longitudinal direction (Z-direction) of the stack, and a second electrode that applies a voltage to the piezoelectric layers to cause the stack to bend in a second direction (Y-direction) orthogonal to the longitudinal direction and to the first direction. The stack includes a groove extending in the longitudinal direction on an upper surface of the stack.

5 Claims, 8 Drawing Sheets

(51) Int. Cl.
   *H10N 30/50*          (2023.01)
   *H10N 30/87*          (2023.01)
(58) Field of Classification Search
   USPC ........................................ 310/328, 365, 366
   See application file for complete search history.

(56)                    References Cited

U.S. PATENT DOCUMENTS

2015/0001998 A1*    1/2015  Katsuta ................... H01G 4/30
                                                         336/200
2015/0113780 A1     4/2015  Tsubokawa
2018/0219494 A1     8/2018  Satoh et al.
2018/0375010 A1    12/2018  Kishimoto et al.

FOREIGN PATENT DOCUMENTS

JP        2000-308373  A    11/2000
JP        2004-531189  A    10/2004
JP        2005-051291  A     2/2005
JP           4240472  B     1/2009
JP        2014-239238  A    12/2014
JP        2015-109413  A     6/2015
JP        2018-125431  A     8/2018

* cited by examiner

FIG. 2C
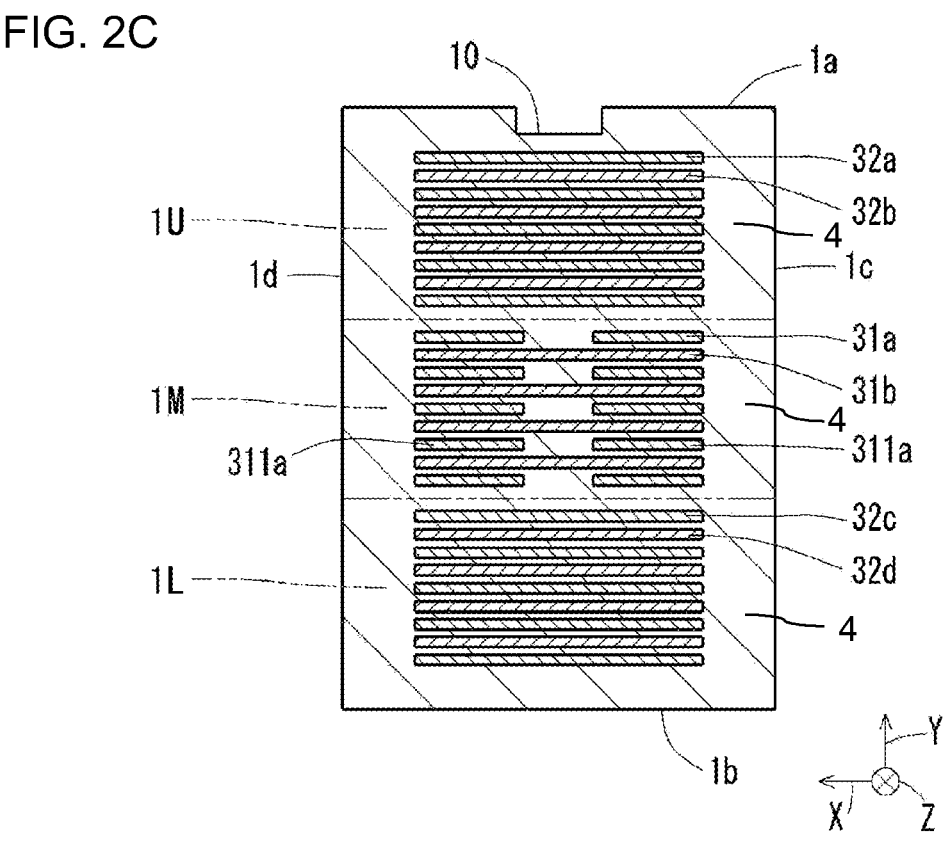
FIG. 3A
FIG. 3B
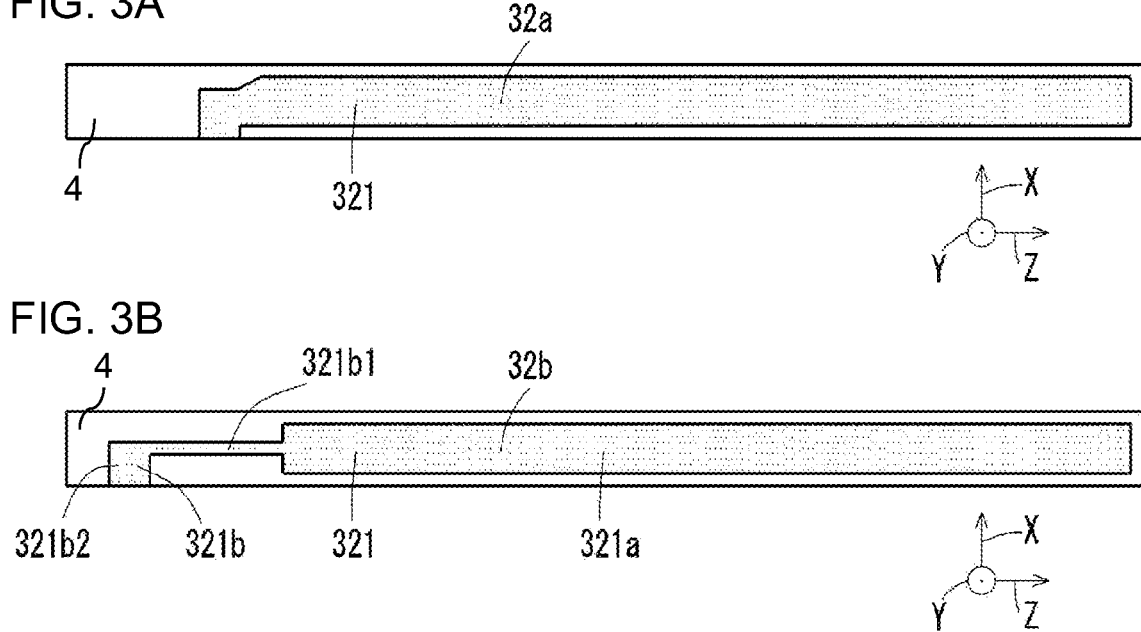

PIEZOELECTRIC ELEMENT

TECHNICAL FIELD

The present disclosure relates to a piezoelectric element.

BACKGROUND OF INVENTION

A known technique is described in, for example, Patent Literature 1.

CITATION LIST

Patent Literature

Patent Literature 1: Japanese Patent No. 4240472

SUMMARY

In an aspect of the present disclosure, a piezoelectric element includes a stack including a plurality of internal electrodes and a plurality of piezoelectric layers alternately stacked on one another, and a surface electrode located on a side surface of the stack and electrically connected to the plurality of internal electrodes. The stack is a rectangular prism with a longitudinal direction orthogonal to a stacking direction. The plurality of internal electrodes includes a first electrode that applies a voltage to the plurality of piezoelectric layers to cause the stack to bend in a width direction orthogonal to the stacking direction and to the longitudinal direction, and a second electrode that applies a voltage to the plurality of piezoelectric layers to cause the stack to bend in the stacking direction. The stack includes a groove extending in the longitudinal direction on at least one of an upper surface or a lower surface of the stack orthogonal to the stacking direction.

BRIEF DESCRIPTION OF THE DRAWINGS

The objects, features, and advantages of the present disclosure will become more apparent from the following detailed description and the drawings.

FIG. 2C is a cross-sectional view taken along line C-C in FIG. 1A.

FIG. 3A is a diagram of an internal electrode pattern.

FIG. 3B is a diagram of an internal electrode pattern.

DESCRIPTION OF EMBODIMENTS

A piezoelectric element with the structure that forms the basis of a piezoelectric element according to one or more embodiments of the present disclosure includes piezoelectric layers and internal electrodes that are stacked on one another. The piezoelectric element is used as a piezoelectric actuator that deforms by bending in response to a voltage applied to the internal electrodes. Such a piezoelectric actuator can deform slightly with high precision.

A piezoelectric actuator described in Patent Literature 1 is elongated along Z-axis and has an end movable in the XY plane.

Figure 1A:
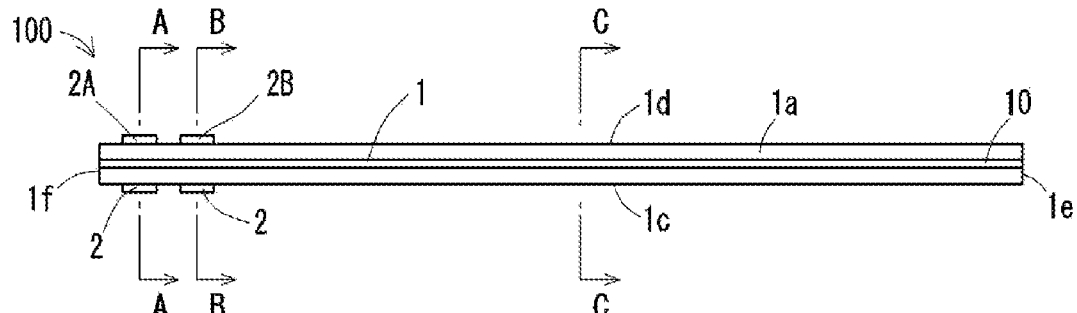
FIG. 1A is an external plan view of a piezoelectric element.
Figure 1B:
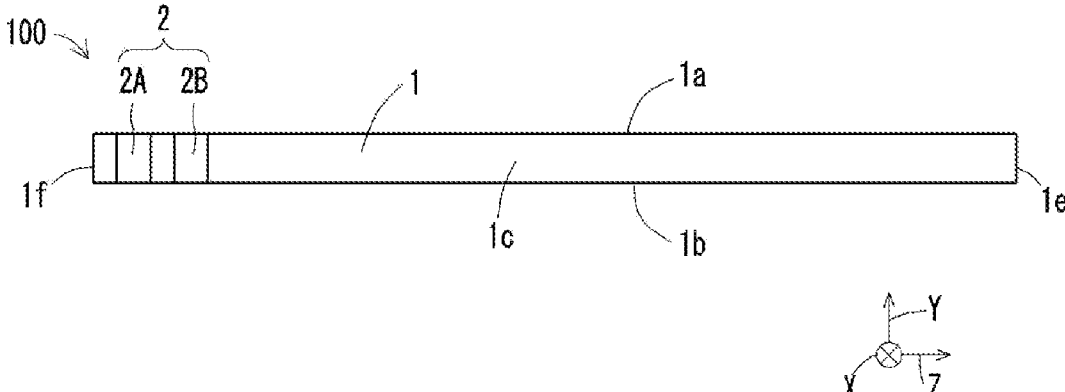
FIG. 1B is an external side view of the piezoelectric element.
Figure 1C:
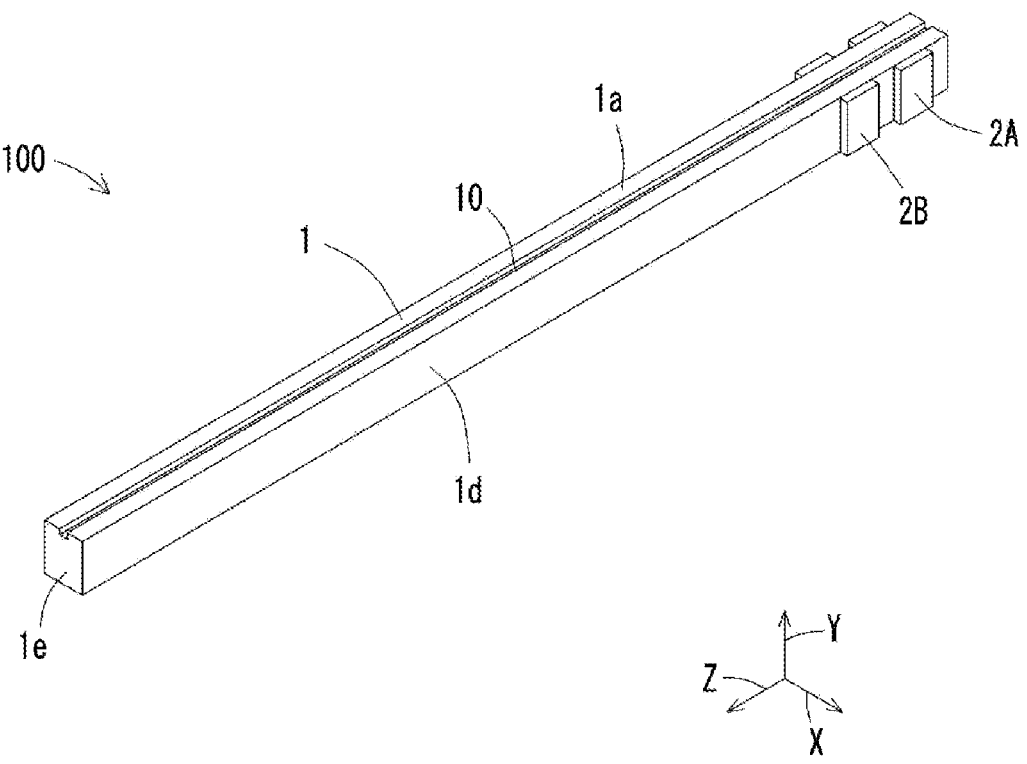
FIG. 1C is an external perspective view of the piezoelectric element.
Figure 2A:
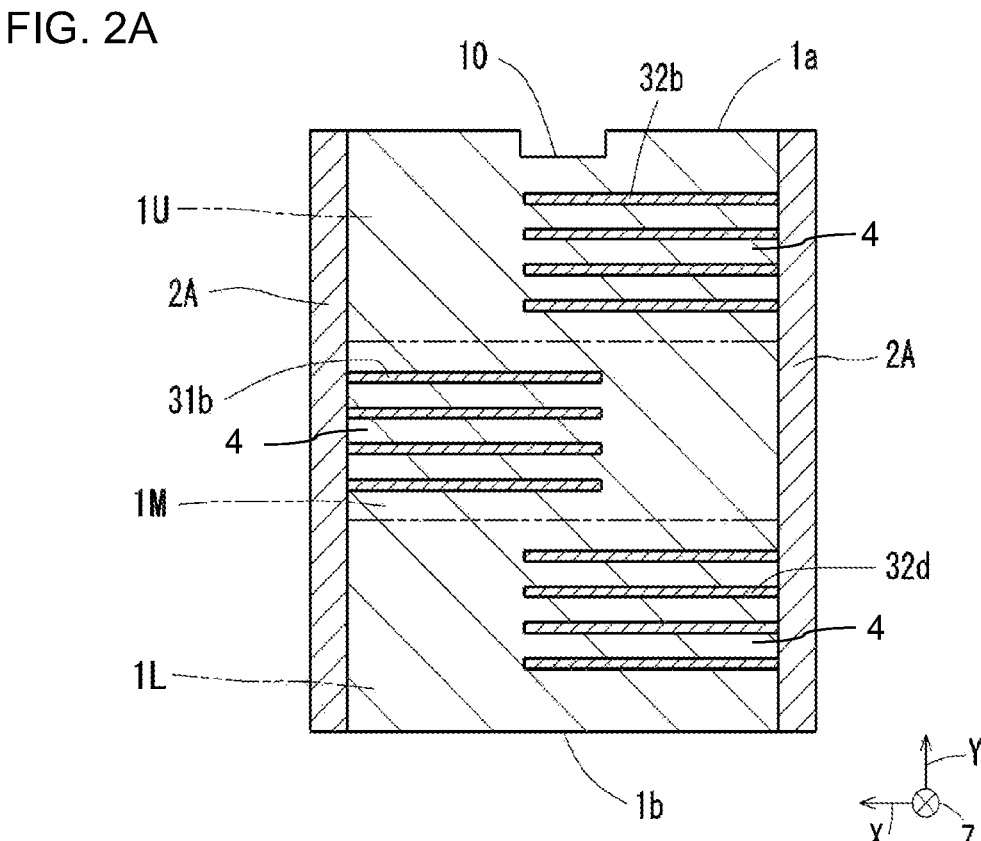
FIG. 2A is a cross-sectional view taken along line A-A in FIG. 1A.
Figure 2B:
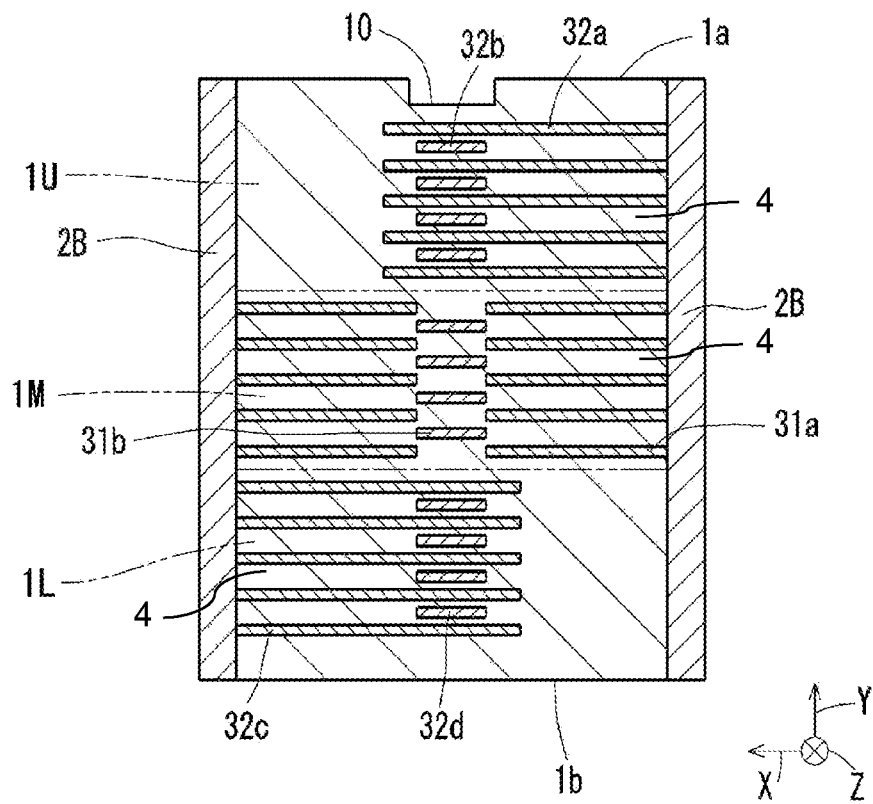
FIG. 2B is a cross-sectional view taken along line B-B in FIG. 1A.

FIG. 1A is an external plan view of a piezoelectric element, and FIG. 1B is an external side view of the piezoelectric element. FIG. 1C is an external perspective view of the piezoelectric element. FIG. 2A is a cross-sectional view taken along line A-A in FIG. 1A. FIG. 2B is a cross-sectional view taken along line B-B in FIG. 1A. FIG. 2C is a cross-sectional view taken along line C-C in FIG. 1A. A piezoelectric element 100 includes a stack 1 including internal electrodes 3 and piezoelectric layers 4 that are stacked on one another and surface electrodes 2 located on side surfaces of the stack 1 and electrically connected to the internal electrodes 3. In the present embodiment, the piezoelectric element 100 is a piezoelectric actuator that applies a voltage to the internal electrodes 3 through the surface electrodes 2 to cause the stacked piezoelectric layers 4 to deform by bending. As illustrated in FIGS. 1A to 1C, the piezoelectric element 100 according to the present embodiment is, for example, a rectangular or quadrangular prism, and has one end in its longitudinal or axial direction movable as the piezoelectric element 100 deforms by bending. The surface electrodes 2 are located on the two side surfaces of the other end opposite to the movable end. The surface electrodes 2 include surface electrodes 2A on the two side surfaces of the other end and surface electrodes 2B on the two side surfaces nearer the middle than the surface electrodes 2A. The longitudinal or the axial direction is hereafter referred to as Z-direction. The direction orthogonal to Z-direction and connecting the two side surfaces on which the surface electrodes 2 are located is referred to as X-direction. The stacking direction orthogonal to Z- and X-directions and in which the internal electrodes 3 and the piezoelectric layers 4 are stacked is referred to as Y-direction.

As illustrated in the cross-sectional view of FIG. 2A or other figures, the stack 1 includes the piezoelectric layers 4 being stacked and the internal electrodes 3 each between adjacent piezoelectric layers 4. The stack 1 includes an upper surface 1a and a lower surface 1b orthogonal to the stacking direction (Y-direction), two side surfaces 1c and 1d orthogonal to a width direction (X-direction), and a front surface 1e and a rear surface 1f orthogonal to the longitudinal direction (Z-direction). The surface electrodes 2 are located on the two side surfaces 1c and 1d. The internal electrodes 3 are exposed on the side surfaces of the other end of the stack 1 and are electrically connected to the surface electrodes 2. The piezoelectric layers 4 are made of a ceramic material having piezoelectric properties. Examples of the ceramic material include perovskite-type oxides containing lead zirconate titanate ($PbZrO_3$—$PbTiO_3$), lithium niobate ($LiNbO_3$), and lithium tantalate ($LiTaO_3$). The internal electrodes 3 may include, for example, a conductor containing, as a main component, silver or a silver-palladium alloy less reactive with a ceramic material or a conductor containing copper or platinum. The surface electrodes 2 may be made of, for example, the same or similar materials to the internal electrode 3, and may further be plated to prevent oxidation.

As described in detail later, the internal electrodes 3 include first electrodes 31 that apply a voltage to the piezoelectric layers 4 to cause the stack 1 to bend in a first direction (X-direction) orthogonal to the longitudinal direction (Z-direction) of the stack 1 and second electrodes 32 that apply a voltage to the piezoelectric layers 4 to cause the stack 1 to bend in a second direction (Y-direction) orthogonal to the longitudinal direction and to the first direction. For example, the stack 1 is divided into substantially three areas in the stacking direction (Y-direction). The three areas include a middle area 1M for causing the piezoelectric element 100 to deform by bending in X-direction (lateral direction). The first electrodes 31 are located in the middle area 1M. The three areas further include an upper area 1U and a lower area 1L for causing the piezoelectric element 100 to deform by bending in Y-direction (vertical direction). The second electrodes 32 are located in the upper area 1U and the lower area 1L.

For example, to cause the piezoelectric element 100 to deform by bending in X-direction, the first electrodes 31 in the middle area 1M receive a voltage to have an expanded right portion and a contracted left portion. This causes the piezoelectric element 100 to bend leftward. The first electrodes 31 receive a voltage to have a contracted right portion and an expanded left portion. This causes the piezoelectric element 100 to bend rightward. Similarly, for example, to cause the piezoelectric element 100 to deform by bending in Y-direction, the second electrodes 32 receive a voltage to have an expanded upper area 1U and a contracted lower area 1L. This causes the piezoelectric element 100 to bend downward. The second electrodes 32 receive a voltage to have a contracted upper area 1U and an expanded lower area 1L. This causes the piezoelectric element 100 to bend upward.

Figure 3C:
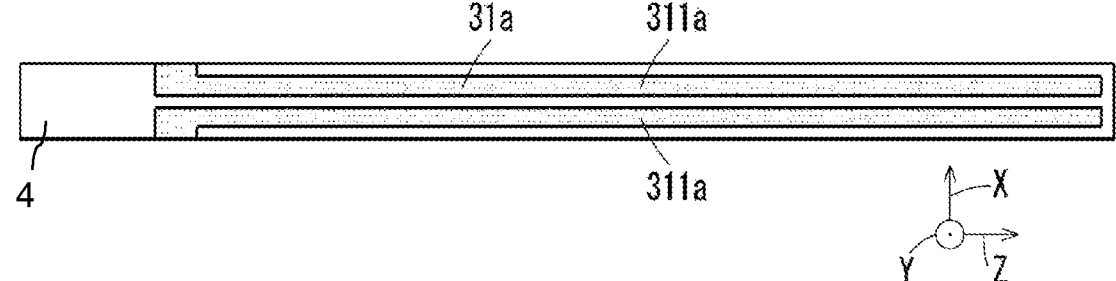
FIG. 3C is a diagram of an internal electrode pattern.
Figure 3D:
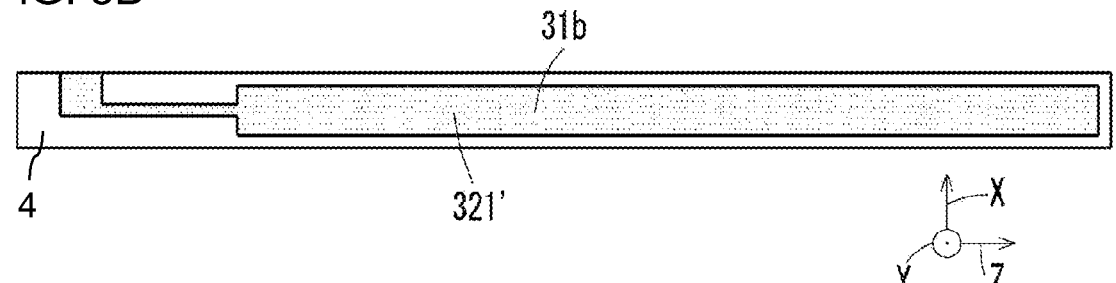
FIG. 3D is a diagram of an internal electrode pattern.
Figure 3E:
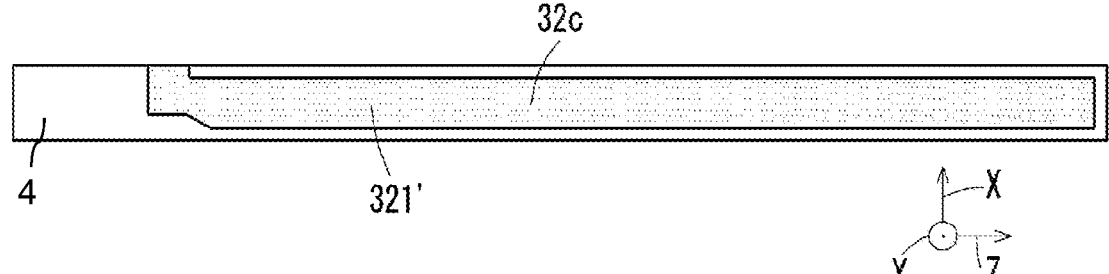
FIG. 3E is a diagram of an internal electrode pattern.
Figure 3F:
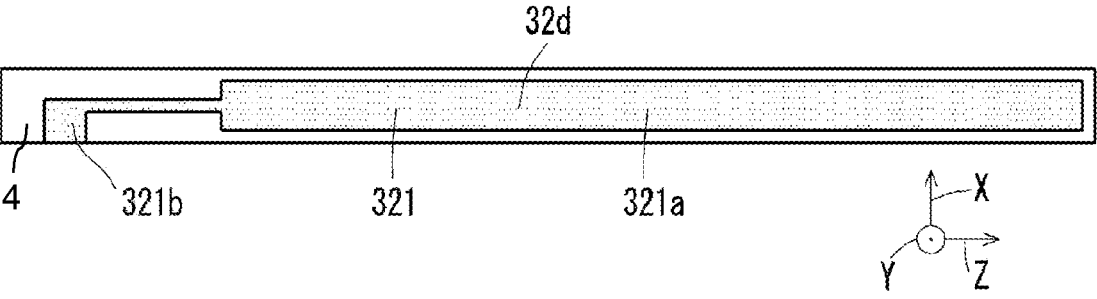
FIG. 3F is a diagram of an internal electrode pattern.

FIGS. 3A to 3F illustrate example patterns on the internal electrodes 3 in the present embodiment. These are example patterns on the second electrodes 32 in the upper area 1U, the first electrodes 31 in the middle area 1M, and the second electrodes 32 in the lower area 1L. The patterns illustrated in FIGS. 3A and 3B are defined on the second electrodes 32 in the upper area 1U. The patterns illustrated in FIGS. 3C and 3D are defined on the first electrodes 31 in the middle area 1M. The patterns illustrated in FIGS. 3E and 3F are defined on the second electrodes 32 in the lower area 1L. Each area includes the internal electrodes 3 having two different patterns. The internal electrodes 3 having two different patterns are alternately located between the piezoelectric layers 4 in Y-direction. During the operation of the piezoelectric element 100, a voltage is applied externally through the surface electrodes 2 to generate a potential difference between the two different internal electrodes 3. The piezoelectric element 100 can deform by bending in X- and Y-directions as described above. A voltage applied to the surface electrodes 2 can be varied to control the degree of deformation and the direction of bending.

The second electrodes 32 in the upper area 1U correspond to second electrodes 32a each illustrated in FIG. 3A and to second electrodes 32b each illustrated in FIG. 3B. The second electrodes 32 in the lower area 1L correspond to second electrodes 32c each illustrated in FIG. 3E and to second electrodes 32d each illustrated in FIG. 3F. Each second electrode 32b illustrated in FIG. 3B includes a first conductor 321 including a rectangular portion 321a extending in the longitudinal direction and an extension 321b having one end continuous with the rectangular portion 321a and the other end exposed on the side surface of the stack 1 and connected to the surface electrode 2A. The second electrode 32d illustrated in FIG. 3F has the same pattern as the second electrode 32b illustrated in FIG. 3B. The second electrode 32d includes the first conductor 321, in the same or similar manner as the second electrode 32b. The extension 321b is, for example, substantially L-shaped. The extension 321b has one end continuous with the middle of the rectangular portion 321a and extending linearly in Z-direction, and the other end bending at right angles toward the side surface of the stack 1 to be exposed on the side surface of the stack 1. The substantially L-shaped extension 321b includes a wire 321b1 having a smaller width than the rectangular portion 321a and a connection 321b2 continuous with the wire 321b1. The connection 321b2 is exposed on the side surface and connected to the surface electrodes 2. The second electrode 32b in FIG. 3B and the second electrode 32d in FIG. 3F include the rectangular portions 321a and have patterns symmetrical to each other with respect to Z-direction.

The piezoelectric element 100 may have any dimensions. For example, the piezoelectric element 100 may have a length of 1 to 3 mm in X-direction, a length of 1 to 2 mm in Y-direction, and a length of 20 to 50 mm in Z-direction. The internal electrodes 3 may each have a thickness of 0.1 to 5 The piezoelectric layers 4 may each have a thickness of 0.01 to 0.1 mm.

The first electrodes 31 in the middle area 1M correspond to first electrodes 31a each illustrated in FIG. 3C and to first electrodes 31b each illustrated in FIG. 3D. Each first electrode 31a includes a pair of strips 311a extending parallel to each other in the longitudinal direction. In the present embodiment, for example, the strips 311a are spaced from each other across a middle portion of the stack 1 in the width direction. Each first electrode 31b has a pattern symmetrical to the pattern on the second electrode 32b with respect to Z-direction. More specifically, in the present embodiment, the first electrode 31b in FIG. 3D includes a first conductor 321' that is symmetrical to the first conductor 321 in the second electrode 32b in FIG. 3B with respect to Z-direction. In the present embodiment, the second electrode 32d in FIG. 3F includes the same first conductor 321 as the second electrode 32b in FIG. 3B. Additionally, the second electrode 32a illustrated in FIG. 3A and the second electrode 32c illustrated in FIG. 3E include a first conductor 321 and a first conductor 321' having a shape similar to the shape of the first conductor 321.

The stack 1 includes a groove 10 extending in the longitudinal direction (Z-direction) on at least one of the upper surface 1a or the lower surface 1b. When the piezoelectric element 100 deforms, the piezoelectric layers 4 include inactive areas with an insufficient level of voltage being applied. For example, the inactive areas include, in the upper area 1U and the lower area 1L, the outermost layers including the upper and lower surfaces 1a and 1b of the stack 1 that are not located between electrodes, and, in the middle area 1M, the middle portion in the width direction located between the pair of strips 311a. When the piezoelectric element 100 deforms in the width direction, the inactive areas in the upper area 1U, the middle area 1M, and the lower area 1L obstruct the deformation and cause insufficient deformation of the piezoelectric element 100. The groove 10 on at least one of the upper surface 1a or the lower surface 1b of the stack 1 reduces the inactive area in the upper area 1U or the lower area 1L, thus increasing the degree of deformation. In the present embodiment, the stack 1 includes the groove 10 on the upper surface 1a to reduce the inactive area in the upper area 1U.

In the present embodiment, the groove 10 has a rectangular cross section. The groove 10 may have a U- or V-shaped cross section, or may be a part of a circle (including an ellipse) such as a semicircle. The groove 10 may extend continuously or partially discontinuously (intermittently) in the longitudinal direction on the upper surface 1a of the stack 1. The intermittent groove 10 may have, for example, the total length greater than or equal to 50% of the length (longitudinal dimension) of the stack 1. The groove 10 may have a depth of, for example, 0.01 to 5% inclusive of the thickness of the stack 1 (dimension in the stacking direction). The groove 10 may have a width of, for example, 0.1 to 20% inclusive of the width of the stack 1 (dimension in the width dimension).

The groove 10 may be at any position on the upper surface 1a of the stack 1 to reduce the inactive area. In the present embodiment, for example, the groove 10 is located in a middle portion of the upper surface 1a in the width direction. The groove 10 in the middle portion in the width direction allows the piezoelectric element 100 to increase the degree of deformation equally in one direction along the width and in the other direction along the width. The middle area 1M includes the inactive area in the middle portion in the width direction between the pair of strips 311a. The groove 10 in the middle portion in the width direction reduces the inactive area in the middle area 1M that obstructs the deformation.

The operation of the piezoelectric element 100 will be described briefly. First, the electrical connection between the surface electrodes 2 and the internal electrodes 3 will be described. One surface electrode 2A is electrically connected to the second electrodes 32b in the upper area 1U and the second electrodes 32d in the lower area 1L. The other surface electrode 2A is electrically connected to the first electrodes 31b in the middle area 1M. One surface electrode 2B is electrically connected to the second electrodes 32a in the upper area 1U and the first electrodes 31a (at one side) in the middle area 1M. The other surface electrode 2B is electrically connected to the first electrodes 31a (at the other side) in the middle area 1M and the second electrodes 32c in the lower area 1L. The polarization direction of the piezoelectric layers 4 includes a first direction and a second direction. One side of each of the upper area 1U and the middle area 1M corresponds to the first direction. The other side of each of the lower area 1L and the middle area 1M corresponds to the second direction opposite to the first direction. For example, the surface electrodes 2A are set to a ground potential. A voltage of −64 V is applied to one surface electrode 2B and +64 V to the other surface electrode 2B to polarize the piezoelectric layers 4 as described above.

A constant voltage is applied to each of the surface electrodes 2B during operation. An example voltage to be applied is +11 V to one surface electrode 2B and +61 V to the other surface electrode 2B. A voltage of 0 to +72 V applied to both the surface electrodes 2A can cause the piezoelectric element 100 to deform by bending in an intended direction. For example, a voltage of +72 V is applied to one surface electrode 2A and +36 V to the other surface electrode 2A to cause the piezoelectric element 100 to deform by bending (at a maximum degree) in one Y-direction (upward), and a voltage of 0 V is applied to one surface electrode 2A and +36 V to the other surface electrode 2A to cause the piezoelectric element 100 to deform by bending (at a maximum degree) in the other Y-direction (downward). In other words, a voltage of 0 to +72 V is applied to one surface electrode 2A, and a constant voltage of +36 V is applied to the other surface electrode 2A to adjust the degree by which the deformation by bending occurs in Y-direction. For example, a voltage of +36 V is applied to one surface electrode 2A and +72 V to the other surface electrode 2A to cause the piezoelectric element 100 to deform by bending (at a maximum degree) in one X-direction (rightward). A voltage of +36 V is applied to one surface electrode 2A and 0 V to the other surface electrode 2A to cause the piezoelectric element 100 to deform by bending (at a maximum degree) in the other X-direction (leftward). In other words, a constant voltage of +36 V is applied to one surface electrode 2A, and a voltage of 0 to +72 V is applied to the other surface electrode 2A to adjust the degree by which the deformation by bending occurs in X-direction. A voltage to be applied to both the surface electrodes 2A is varied within the range of 0 to +72 V to cause the deformation by bending in an oblique direction.

Figure 4:
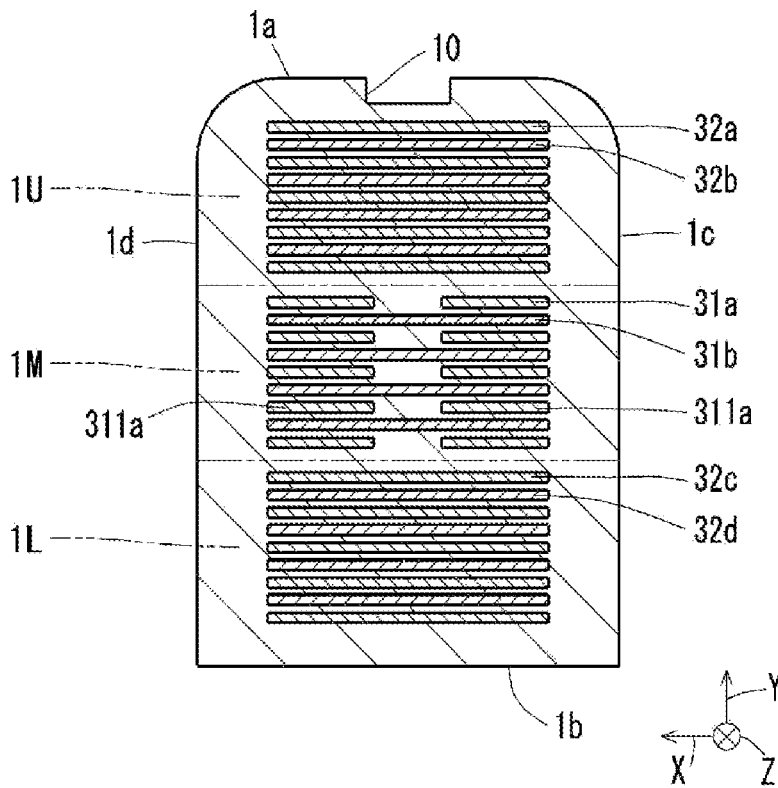
FIG. 4 is a cross-sectional view of a piezoelectric element according to another embodiment.

FIG. 4 is a cross-sectional view of a piezoelectric element according to another embodiment. The cross-sectional view in FIG. 4 corresponds to the cross-sectional view illustrated in FIG. 2C. In the present embodiment, the stack 1 includes round corners at which the upper surface 1a including the groove 10 intersects with the side surfaces 1c and 1d. More specifically, the piezoelectric element 100 according to the present embodiment includes chamfered and round corners at which the upper surface 1a and the side surfaces 1c and 1d of the stack 1 intersect with each other. The chamfered corners of the upper surface 1a of the stack 1 can further reduce the inactive area in the upper area 1U, thus increasing the degree of deformation. The chamfered corners can also reduce chips and cracks in the corners of the upper area 1U.

Figure 5:
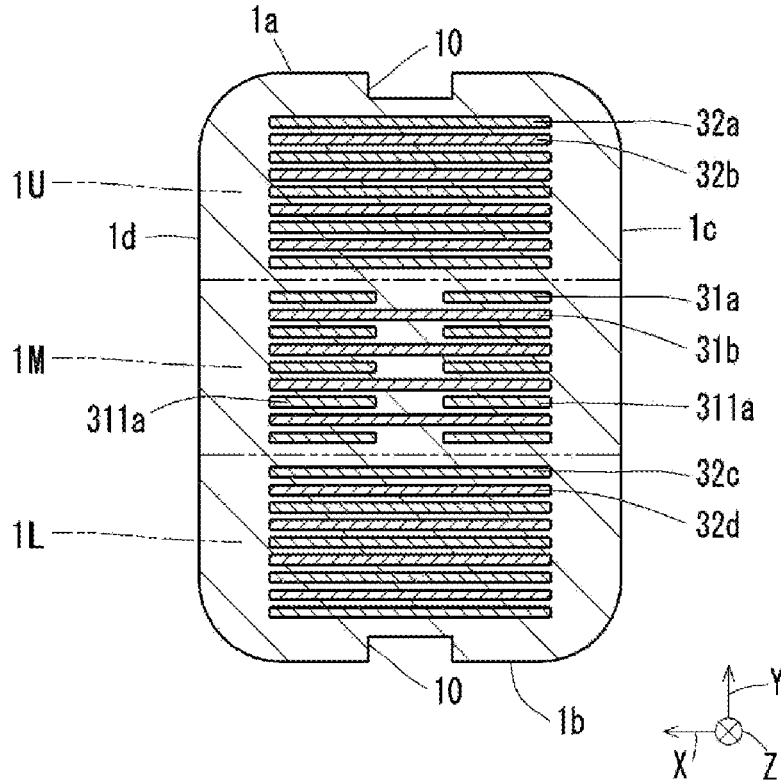
FIG. 5 is a cross-sectional view of a piezoelectric element according to another embodiment.

FIG. 5 is a cross-sectional view of a piezoelectric element according to another embodiment. The cross-sectional view in FIG. 5 corresponds to the cross-sectional view illustrated in FIG. 2C. In the present embodiment, the stack 1 includes the groove 10 on the lower surface 1b in addition to the upper surface 1a. The groove 10 may be at any position on the lower surface 1b of the stack 1 to reduce the inactive area. In the present embodiment, for example, the groove 10 is located in a middle portion of the lower surface 1b in the width direction. The groove 10 in the middle portion in the width direction allows the piezoelectric element 100 to increase the degree of deformation equally in one direction along the width and in the other direction along the width. The groove 10 on the upper surface 1a and the groove 10 on the lower surface 1b may have, for example, the same shape and dimensions, the same shape and different dimensions, or different shapes. The groove 10 on the upper surface 1a and the groove 10 on the lower surface 1b may be, for example, at the same position or at different positions as viewed in plan. The groove 10 on the lower surface 1b can reduce the inactive area in the lower area 1L, thus increasing the degree of deformation. The stack 1 may include round corners at which the lower surface 1b including the groove 10 intersect with the side surfaces 1c and 1d. The chamfered corners of the lower surface 1b of the stack 1 can further reduce the inactive area in the lower area 1L, thus increasing the degree of deformation. The chamfered corners can also reduce chips and cracks in the corners of the lower area 1L.

Figure 6:
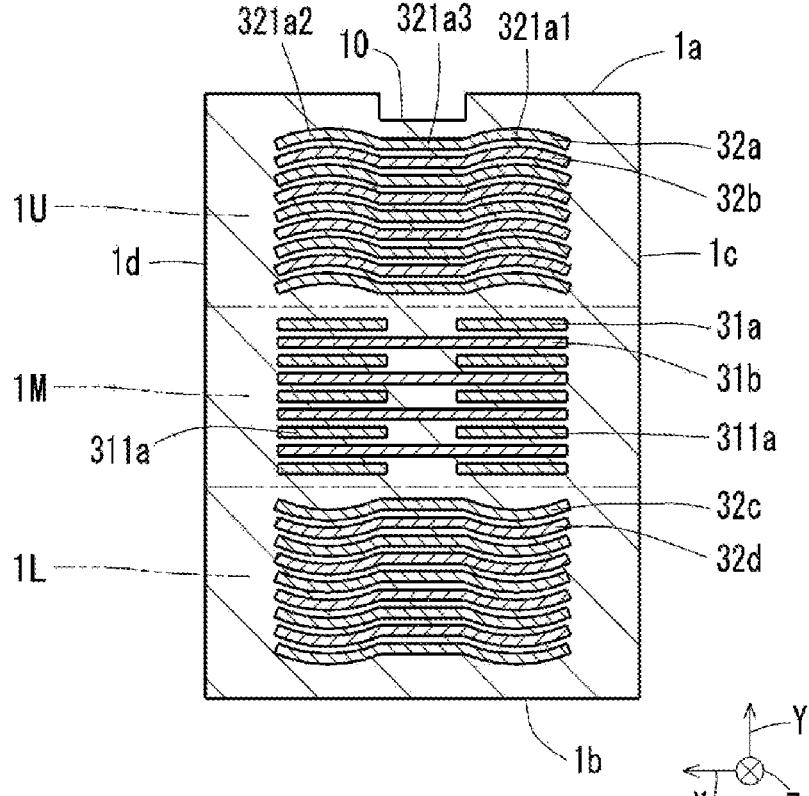
FIG. 6 is a cross-sectional view of a piezoelectric element according to another embodiment.

FIG. 6 is a cross-sectional view of a piezoelectric element according to another embodiment. The cross-sectional view in FIG. 6 corresponds to the cross-sectional view illustrated in FIG. 2C. The rectangular portions 321a of the second electrodes 32a and the second electrodes 32b in the upper area 1U of the stack 1 each include at least one of end portions in the width direction arched upward in the stacking direction. Each rectangular portion 321a includes three portions in the width direction. The three portions each extend in the longitudinal direction. Each rectangular portion 321a includes, for example, an end portion 321a1 adjacent to the side surface 1c, an end portion 321a2 adjacent to the side surface 1d, and a middle portion 321a3 between the end portions 321a1 and 321a2. The three portions may not be defined by clear boundaries. At least one of the end portion 321a1 adjacent to the side surface 1c or the end portion 321a2 adjacent to the side surface 1d is arched upward in the stacking direction. In the present embodiment, both the end portion 321a1 adjacent to the side surface 1c and the end portion 321a2 adjacent to the side surface 1d are arched upward in the stacking direction. With the rectangular portion 321a of the second electrode 32 being a flat plate, the piezoelectric element 100 deforming in the width direction deforms in the planar direction of the flat plate. The plate is less likely to deform in the planar direction than in other directions and may thus obstruct the deformation of the piezoelectric element 100 in the width direction. In the upper area 1U of the stack 1, the rectangular portions 321a are at least partially arched upward in the stacking direction. This causes the stack 1 to deform easily in the width direction, thus increasing the degree of deformation of the piezoelectric element 100 in the width direction.

In the present embodiment, the end portions 321a1 and the end portion 321a2 are, for example, arched upward and outward in the stacking direction. In the present embodiment, although the middle portion 321a3 is flat, the middle portion 321a3 may also be arched upward in the stacking direction, in the same or similar manner as the two end portions 321a1 and 321a2. In addition to the upper area 1U of the stack 1, the rectangular portions 321a of the second electrodes 32c and the second electrodes 32d in the lower area 1L may each include at least one of the end portions in the width direction arched upward in the stacking direction, in the same or similar manner as in the upper area 1U. In the present embodiment, the two end portions of each rectangular portion 321a in the width direction are arched upward and outward in the stacking direction. In the lower area 1L of the stack 1 as well, the rectangular portions 321a are at least partially arched upward in the stacking direction. This causes the stack 1 to easily deform in the width direction, thus further increasing the degree of deformation of the piezoelectric element 100 in the width direction.

Figure 7:
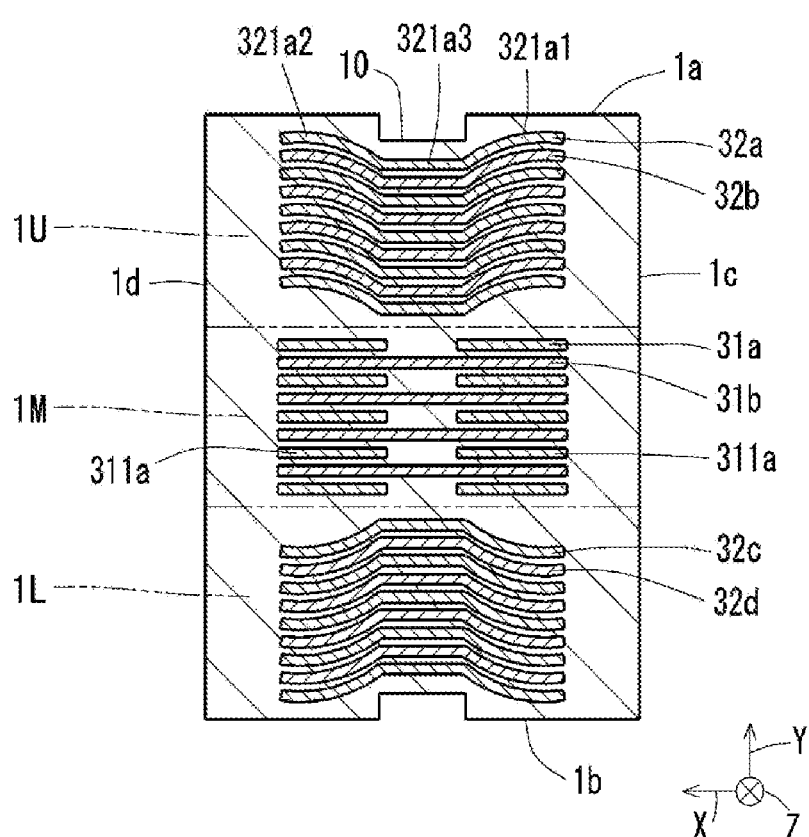
FIG. 7 is a cross-sectional view of a piezoelectric element according to another embodiment.

FIG. 7 is a cross-sectional view of a piezoelectric element according to another embodiment. The cross-sectional view in FIG. 7 corresponds to the cross-sectional view illustrated in FIG. 2C. The rectangular portions 321a of the second electrodes 32a and the second electrodes 32b in the upper area 1U of the stack 1 each include at least one of the end portions in the width direction arched upward in the stacking direction. In the present embodiment, the arched end portions have their outer portions in the width direction located more outward in the stacking direction than their inner portions in the width direction. More specifically, the arched end portions of the rectangular portions 321a are inclined with respect to the upper surface 1a and the lower surface 1b of the stack 1. In the present embodiment, the rectangular portions 321a include, for example, the end portions 321a1 adjacent to the side surface 1c and the end portions 321a2 adjacent to the side surface 1d arched upward in the stacking direction and inclined with respect to the upper surface 1a and the lower surface 1b of the stack 1. In the upper area 1U of the stack 1, at least a part of each rectangular portion 321a is inclined to cause the stack 1 to easily deform in the width direction, thus increasing the degree of deformation of the piezoelectric element 100 in the width direction.

In addition to the upper area 1U of the stack 1, the rectangular portions 321a of the second electrodes 32c and the second electrodes 32d in the lower area 1L may each include at least one of the end positions in the width direction arched upward in the stacking direction with the arched end portions including their outer portions in the width direction located more outward in the stacking direction than their inner portions in the width direction, in the same or similar manner as in the upper area 1U. In the present embodiment, the two end portions of the rectangular portion 321a in the width direction are arched upward and outward in the stacking direction and inclined with respect to the upper surface 1a and the lower surface 1b of the stack 1. In the lower area 1L of the stack 1 as well, at least a part of each rectangular portion 321a is inclined to cause the stack 1 to easily deform in the width direction, thus increasing the degree of deformation of the piezoelectric element 100 in the width direction.

Figure 8:
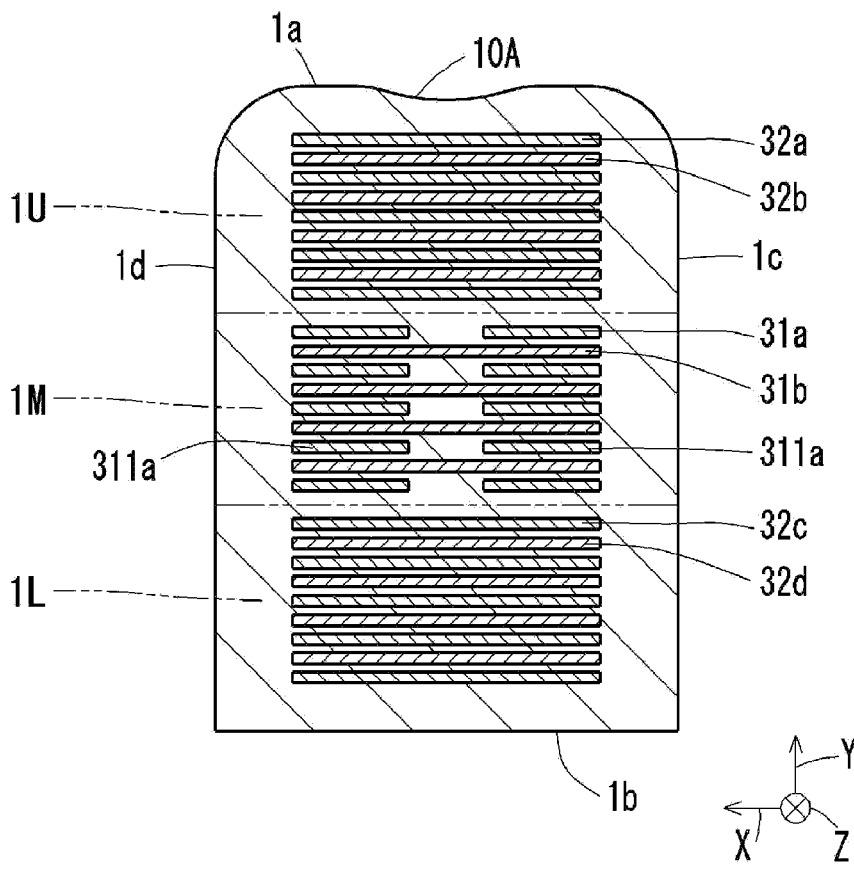
FIG. 8 is a cross-sectional view of a piezoelectric element according to another embodiment.

FIG. 8 is a cross-sectional view of a piezoelectric element according to another embodiment. The cross-sectional view in FIG. 8 corresponds to the cross-sectional view illustrated in FIG. 2C or FIG. 4. The stack 1 includes a groove 10A located on at least one of the upper surface 1a or the lower surface 1b. The groove 10A extends in the longitudinal direction (Z-direction) and may have, for example, a curved bottom in the shape of, for example, a recess or a concave. In the present embodiment, the groove 10A may have, for example, curved edges smoothly connected to the upper surface 1a as viewed in the cross section as illustrated in FIG. 8. This reduces concentration of stress at the bottom of the groove 10A and thus reduces chips and cracks in the edges of the groove 10A.

The present disclosure may be implemented in the following forms.

In an embodiment of the present disclosure, a piezoelectric element includes a stack including a plurality of internal electrodes and a plurality of piezoelectric layers alternately stacked on one another, and a surface electrode located on a side surface of the stack and electrically connected to the plurality of internal electrodes. The stack is a rectangular prism with a longitudinal direction orthogonal to a stacking direction. The plurality of internal electrodes includes a first electrode that applies a voltage to the plurality of piezoelectric layers to cause the stack to bend in a width direction orthogonal to the stacking direction and to the longitudinal direction, and a second electrode that applies a voltage to the plurality of piezoelectric layers to cause the stack to bend in the stacking direction. The stack includes a groove extending in the longitudinal direction on at least one of an upper surface or a lower surface of the stack orthogonal to the stacking direction.

The piezoelectric element according to one or more embodiments of the present disclosure reduces the inactive area to increase the degree of deformation.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

REFERENCE SIGNS 1 stack
1a upper surface
1b lower surface
1c, 1d side surface
1e front surface
1f rear surface
1L lower area
1M middle area
1U upper area
2, 2A, 2B surface electrode
3 internal electrode
4 piezoelectric layer
31, 31a, 31b first electrode
32, 32a, 32b, 32c, 32d second electrode
100 piezoelectric element
311a strip
321, 321' first conductor
321a rectangular portion
321a1 end portion
321a2 end portion
321a3 middle portion
321b extension
321b1 wire
321b2 connection

The invention claimed is:

1. A piezoelectric element comprising:
a stack including a plurality of internal electrodes and a plurality of piezoelectric layers alternately stacked on one another, the stack being a rectangular prism with a longitudinal direction orthogonal to a stacking direction; and
a surface electrode on a side surface of the stack, the surface electrode being electrically connected to the plurality of internal electrodes,
wherein the plurality of internal electrodes includes
a first electrode configured to apply a voltage to the plurality of piezoelectric layers to cause the stack to bend in a width direction orthogonal to the stacking direction and to the longitudinal direction, and
a second electrode configured to apply a voltage to the plurality of piezoelectric layers to cause the stack to bend in the stacking direction; and
the stack includes a groove extending in the longitudinal direction on at least one of an upper surface or a lower surface of the stack orthogonal to the stacking direction.

2. The piezoelectric element according to claim 1, wherein
the first electrode includes a pair of strips extending parallel to each other in the longitudinal direction, and
the pair of strips are spaced from each other across a middle portion of the stack in the width direction, and
the groove is in a middle portion of the at least one of the upper surface or the lower surface in the width direction.

3. The piezoelectric element according to claim 1, wherein
the second electrode includes a rectangular portion extending in the longitudinal direction, the rectangular portion including end portions in the width direction, and
at least one end portion of the end portions is arched upward in the stacking direction.

4. The piezoelectric element according to claim 3, wherein
the at least one end portion includes an outer portion and an inner portion in the width direction, and the outer portion is located more outward in the stacking direction than the inner portion.

5. The piezoelectric element according to claim 1, wherein
the stack includes a round corner at which the at least one of the upper surface or the lower surface including the groove intersects with the side surface.

* * * * *